United States Patent
Tonegawa et al.

(10) Patent No.: US 11,652,072 B2
(45) Date of Patent: May 16, 2023

(54) SEMICONDUCTOR DEVICE AND METHOD OF MANUFACTURING THE SAME

(71) Applicant: RENESAS ELECTRONICS CORPORATION, Tokyo (JP)

(72) Inventors: Takashi Tonegawa, Ibaraki (JP); Hiroshi Inagawa, Ibaraki (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 218 days.

(21) Appl. No.: 17/225,639

(22) Filed: Apr. 8, 2021

(65) Prior Publication Data

US 2021/0225789 A1  Jul. 22, 2021

Related U.S. Application Data

(63) Continuation of application No. 16/029,334, filed on Jul. 6, 2018, now abandoned.

(30) Foreign Application Priority Data

Aug. 24, 2017  (JP) .............................. JP2017-161043

(51) Int. Cl.
*H01L 29/04* (2006.01)
*H01L 23/00* (2006.01)
(Continued)

(52) U.S. Cl.
CPC ........ *H01L 24/05* (2013.01); *H01L 23/49524* (2013.01); *H01L 23/49562* (2013.01);
(Continued)

(58) Field of Classification Search
CPC ....... H01L 24/05; H01L 24/03; H01L 29/045; H01L 29/66712; H01L 29/7802;
(Continued)

(56) References Cited

U.S. PATENT DOCUMENTS 4,710,398 A    12/1987  Homma et al.
4,987,562 A *  1/1991   Watanabe .............. H01L 29/47
                                                    438/653
(Continued)

FOREIGN PATENT DOCUMENTS

JP     59-100565 A   6/1984
JP     2000-235964 A  8/2000
(Continued)

OTHER PUBLICATIONS

Takeshi Nakata et al., "Zincate Treatment and Electroless Ni-P Plating on Al Single-Crystal Surface", Journal of The Surface Finishing Society of Japan, vol. 48, No. 8, pp. 820-825, 1997.
(Continued)

*Primary Examiner* — Shih Tsun A Chou
(74) *Attorney, Agent, or Firm* — McDermott Will & Emery LLP

(57) ABSTRACT

To improve reliability of a semiconductor device. There are provided the semiconductor device and a method of manufacturing the same, the semiconductor including a pad electrode that is formed over a semiconductor substrate and includes a first conductive film and a second conductive film formed over the first conductive film, and a plating film that is formed over the second conductive film and used to be coupled to an external connection terminal (TR). The first conductive film and the second conductive film contains mainly aluminum. The crystal surface on the surface of the first conductive film is different from the crystal surface on the surface of the second conductive film.

6 Claims, 14 Drawing Sheets

(51) Int. Cl.

| | | |
|---|---|---|
| *H01L 29/78* | (2006.01) | |
| *H01L 29/66* | (2006.01) | |
| *H01L 29/861* | (2006.01) | |
| *H01L 29/45* | (2006.01) | |
| *H01L 23/495* | (2006.01) | |
| *H01L 21/3065* | (2006.01) | |
| *H01L 21/02* | (2006.01) | |
| *H01L 21/78* | (2006.01) | |
| *H01L 25/18* | (2023.01) | |
| *H01L 29/739* | (2006.01) | |
| *H01L 29/417* | (2006.01) | |

(52) U.S. Cl.
CPC ........ *H01L 23/49575* (2013.01); *H01L 24/03* (2013.01); *H01L 29/045* (2013.01); *H01L 29/456* (2013.01); *H01L 29/66136* (2013.01); *H01L 29/66712* (2013.01); *H01L 29/66727* (2013.01); *H01L 29/66734* (2013.01); *H01L 29/7802* (2013.01); *H01L 29/7813* (2013.01); *H01L 29/861* (2013.01); H01L 21/0206 (2013.01); H01L 21/3065 (2013.01); H01L 21/78 (2013.01); H01L 25/18 (2013.01); H01L 29/41741 (2013.01); H01L 29/41766 (2013.01); H01L 29/7395 (2013.01); H01L 2224/0345 (2013.01); H01L 2224/0362 (2013.01); H01L 2224/0381 (2013.01); H01L 2224/03452 (2013.01); H01L 2224/03464 (2013.01); H01L 2224/03614 (2013.01); H01L 2224/05084 (2013.01); H01L 2224/05124 (2013.01); H01L 2224/05138 (2013.01); H01L 2224/05147 (2013.01); H01L 2224/05187 (2013.01); H01L 2224/05573 (2013.01); H01L 2224/05644 (2013.01); H01L 2224/05655 (2013.01); H01L 2224/05664 (2013.01); H01L 2224/32245 (2013.01); H01L 2224/33181 (2013.01); H01L 2224/40137 (2013.01); H01L 2224/40247 (2013.01); H01L 2924/05432 (2013.01); H01L 2924/1203 (2013.01); H01L 2924/13055 (2013.01); H01L 2924/13091 (2013.01); H01L 2924/2064 (2013.01); H01L 2924/20105 (2013.01); H01L 2924/35121 (2013.01)

(58) Field of Classification Search
CPC ............... H01L 29/861; H01L 21/3065; H01L 2224/0345; H01L 2224/05124
See application file for complete search history.

(56) References Cited

U.S. PATENT DOCUMENTS

| | | | |
|---|---|---|---|
| 5,187,561 A * | 2/1993 | Hasunuma | ........ H01L 23/53223 257/E21.295 |
| 5,501,174 A | 3/1996 | Cho et al. | |
| 6,319,830 B1 | 11/2001 | Yamaguchi | |
| 7,602,045 B2 | 10/2009 | Nagase et al. | |
| 2015/0364587 A1 | 12/2015 | Yoshinaga et al. | |

FOREIGN PATENT DOCUMENTS

| | | | |
|---|---|---|---|
| JP | 2007-227412 A | | 9/2007 |
| JP | 4973046 B2 | * | 7/2012 |
| JP | 4973046 B2 | | 7/2012 |

OTHER PUBLICATIONS

Sze et al., Physics of Semiconductor Devices, Wiley Interscience, John Wiley & Sons, Inc. 2007, pp. 219-221.

Baier-Saip et al., "Deep oxidation of aluminum by a DC oxygen plasma", Surface & Coatings Technology, No. 195, (2005), pp. 168-175.

Radie et al., "Sputter-deposited amorphous-like tungsten", Surface and Coatings Technology, No. 180-181, (2004), pp. 66-70.

Japanese Notice of Reasons for Refusal issued in corresponding Japanese Patent Application No. 2017-161043, dated Jan. 5, 2021, with English translation.

U.S. PTO Non-Final Office Action issued in related parent U.S. Appl. No. 16/029,334, dated Oct. 17, 2019.

U.S. PTO Final Office Action issued in related parent U.S. Appl. No. 16/029,334, dated Apr. 2, 2020.

U.S. PTO Non-Final Office Action issued in related parent U.S. Appl. No. 16/029,334, dated Aug. 10, 2020.

U.S. PTO Final Office Action issued in related parent U.S. Appl. No. 16/029,334, dated Jan. 8, 2021.

Parent U.S. Appl. No. 16/029,334, filed Jul. 6, 2018.

* cited by examiner

SEMICONDUCTOR DEVICE AND METHOD OF MANUFACTURING THE SAME

CROSS-REFERENCE TO RELATED APPLICATIONS

This is a Continuation of U.S. patent application Ser. No. 16/029,334 filed on Jul. 6, 2018, which claims the benefit of Japanese Patent Application No. 2017-161043 filed on Aug. 24, 2017 including the specification, drawings and abstract are incorporated herein by reference in their entirety.

BACKGROUND

The present invention relates to a semiconductor device and a method of manufacturing the same, which can be applied to, for example, the semiconductor device having an OPM electrode and the method of manufacturing the same.

Recently, based on demands for improving reliability of semiconductor device and so on, there is proposed a structure obtained by forming a pad electrode containing mainly aluminum on a semiconductor substrate, forming a conductive layer called an OPM (Over Pad Metal) electrode on the pad electrode, and coupling an external coupling terminal such as a clip or a bonding wire to the OPM electrode.

For example, Japanese Unexamined Patent Application Publication No. 2000-235964 discloses a technology of forming an OPM electrode made of a nickel film and a gold film on the pad electrode containing mainly aluminum using electroless plating.

Moreover, Japanese Unexamined Patent Application Publication No. 2007-227412 discloses an IGBT module including a diode and an IGBT (Insulated Gate Bipolar Transistor) coupled in antiparallel with each other.

Furthermore, "Zincate Treatment and Electroless Ni—P Plating on Al Single-Crystal Surface," Journal of The Surface Finishing Society of Japan, Vol. 48, No. 8, p. 820-825, 1997 discloses a technology of obtaining a surface, a (110) surface, and a (111) surface from single-crystal aluminum (Al) and then performing a zincate treatment using an aqueous solution containing zinc (Zn) and an electroless Ni—P plating treatment on these surfaces. The above-mentioned document describes study on how the differences among the crystal surfaces affects the size of deposited Zn particles and growth of an Ni—P plating film.

SUMMARY

As disclosed in "Zincate Treatment and Electroless Ni—P Plating on Al Single-Crystal Surface," Journal of The Surface Finishing Society of Japan, Vol. 48, No. 8, p. 820-825, 1997, when zincate treatment is performed on the (100) surface of aluminum, there is a problem that relatively large Zn particles are deposited and the thickness of the Ni—P plating film formed thereon may not be uniform. Because the surface of the Ni—P plating film is rough and does not present a dense film, moisture may easily enter from the outside of the semiconductor device. This may cause such a problem that corrosion occurs to an interface between the Ni—P plating film and an aluminum film, which increases possibility that the Ni—P plating film would be separated from the aluminum film. In such a case, if the OPM electrode made of the plating film of nickel or the like is formed on the pad electrode containing mainly aluminum as described in Japanese Unexamined Patent Application Publication No. 2000-235964, the OPM electrode is easily removed from the pad electrode, thereby reducing reliability of the semiconductor device.

Other problems and novel features will become apparent from the following description and accompanying drawings.

Outline of representative one of embodiments disclosed herein is briefly described below.

According to a semiconductor device and a method of manufacturing the same of one embodiment, the semiconductor device includes: a pad electrode that is formed over a semiconductor substrate and includes a first conductive film and a second conductive film formed over the first conductive film; and a plating film that is formed over the second conductive film and serves to be coupled to an external connection terminal.

According to one embodiment, it is possible to improve reliability of the semiconductor device.

DETAILED DESCRIPTION

Figure 1:
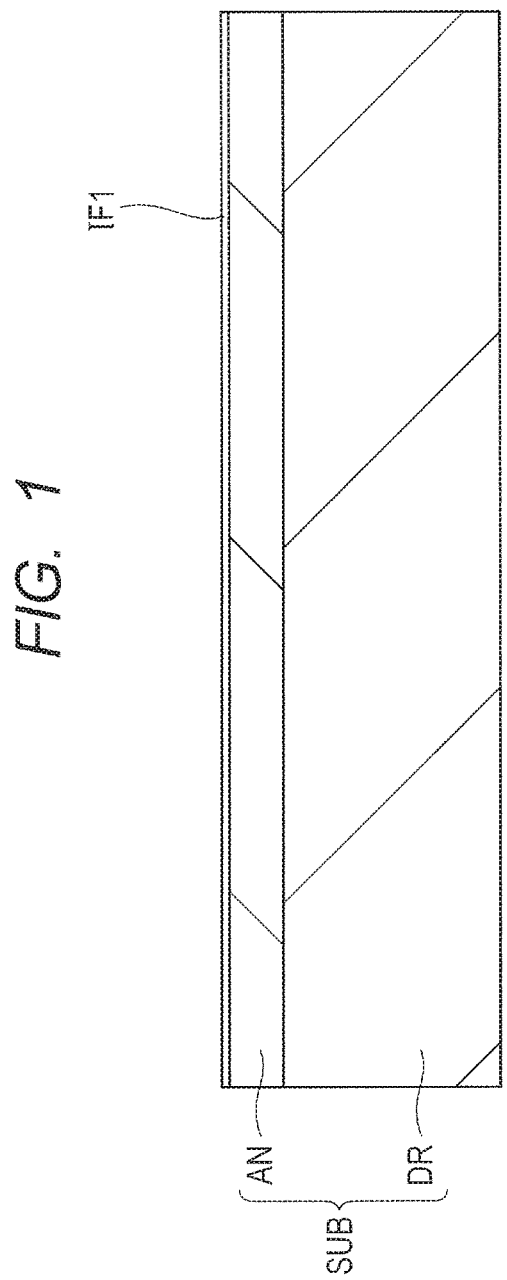
FIG. 1 is a cross-sectional view of a semiconductor device according to a first embodiment.

In the following embodiments, although explanation is given with respect to each section or each embodiment as needed for convenience, the sections or embodiments are not irrelevant to each other but one may be a part or all of a modification, detailed description, or supplementary explanation of another, unless otherwise specified.

Moreover, in the following embodiments, when a number (including number of pieces, numerical value, amount, range and the like) of an element is referenced, it is not limited to the specific number but may be more or less than the specific number, unless otherwise specified or explicitly limited to the specific number in principle.

Furthermore, in the following embodiments, components (including element steps) are not necessarily essential unless otherwise specified or explicitly essential in principle.

Similarly, in the following embodiments, when a shape, positional relationship, or the like of the component is referenced, it includes substantially approximate or similar shape or the like unless otherwise specified or explicitly inapplicable in principle. This also applies to the numerical values and ranges described above.

Throughout the figures for illustrating the embodiments, like reference numerals designate like parts in principle and the description thereof is not repeated. It is to be noted that a plan view may be hatched for better understanding.

First Embodiment

With reference to FIGS. 1 to 7, explanation is given about a semiconductor device and a method of manufacturing the same according to a first embodiment. This embodiment presents a diode DI used as a super fast recover diode (Fast Recovery Diode), for example, as a semiconductor element mounted on the semiconductor device.

As shown in FIG. 1, a substrate is prepared first that has n-type conductivity and includes a semiconductor such as silicon. The substrate configures a drift region DR of the diode DI. An impurity region AN having p-type conductivity is then formed near a surface of the drift region DR by ion implantation or the like. The impurity region AN configures an anode region of the diode DI.

This embodiment describes a configuration including the drift region DR and the anode region AN as a semiconductor substrate SUB.

Here, a crystal surface on a surface of the drift region DR is a surface. Because a silicon substrate having the (001) surface is commonly used, the manufacturing cost can be suppressed compared with preparing a substrate having another crystal surface. Moreover, the crystal surface on the surface of the anode region AN formed over the surface of the drift region DR is also the (001) surface. That is, the crystal surface on the surface of the semiconductor substrate SUB is the (001) surface.

Moreover, FIG. 1 shows a state in which an insulating film IF1 is formed over the surface of the semiconductor substrate SUB as a thin natural oxide film or a foreign matter.

Figure 2:
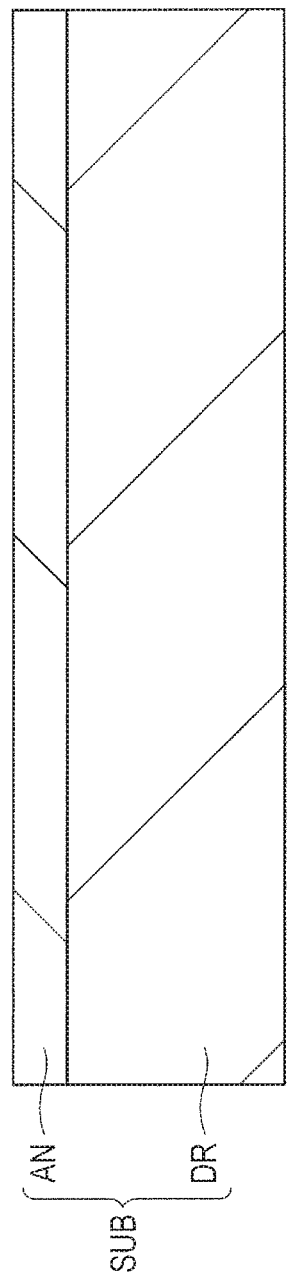
FIG. 2 is a s cross-sectional view of the semiconductor device during a manufacturing process that follows FIG. 1.

Next, as shown in FIG. 2, the surface of the semiconductor substrate SUB is subjected to, for example, a reactive dry etching treatment using a gas containing carbon tetrafluoride (CF4) and a wet etching treatment using a cleaning liquid containing hydrogen fluoride (HF) as a cleaning treatment. The cleaning treatment removes the insulating film IF1 deposited over the surface of the semiconductor substrate SUB including the anode region AN. The cleaning treatment is performed primarily for reducing forward resistance of the diode DI, and thus for reducing contact resistance between the semiconductor substrate SUB and a pad electrode PD that will be formed later.

Figure 3:
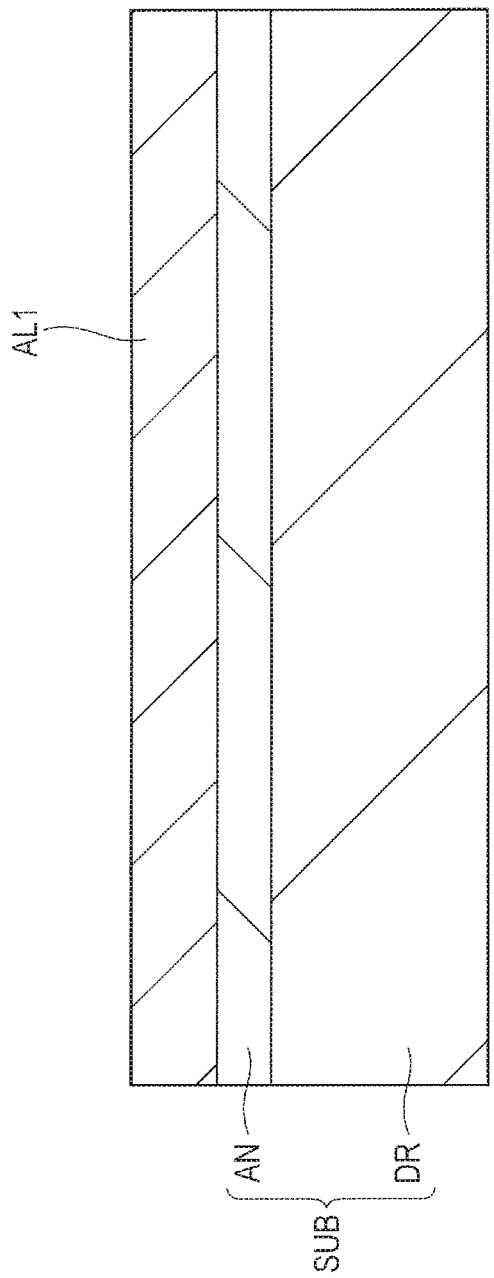
FIG. 3 is a s cross-sectional view of the semiconductor device during the manufacturing process that follows FIG. 2.

Next, as shown in FIG. 3, a conductive film AL1 containing mainly aluminum and doped with a small amount of silicon is formed over the semiconductor substrate SUB by, for example, sputtering. The thickness of the conductive film AL1 is about 2,500 nm. Temperature of formation of the conductive film AL1 by sputtering is about room temperature (23° C.) to 200° C., and more preferably about 150° C. It is to be noted that the reason why the conductive film AL1 is doped with a small amount of silicon is to prevent an interface between the conductive film AL1 and the semiconductor substrate SUB from having a spike shape.

Here, when the conductive film AL1 is an aluminum film, forming the aluminum film by the above-mentioned sputtering makes the crystal structure of the aluminum film a face-centered cubic structure (FCC: Face-Centered Cubic), and therefore the conductive film AL1 has the (111) surface or clos-packed surface on almost all of its surfaces if not affected by its base. However, the conductive film AL1 according to the embodiment is formed taking over the crystal surface of the semiconductor substrate SUB, and thus the crystal surface on the surface of the conductive film AL1 is the (001) surface. This is because the step of forming the conductive film AL1 is performed immediately after the cleaning treatment illustrated in FIG. 2 and therefore the conductive film AL1 tends to take over the crystal surface on the surface of the semiconductor substrate SUB during the forming step. Moreover, with the diode DI according to the embodiment, for the purpose of reducing the forward resistance, a barrier metal film including titanium nitride having higher resistance than that of the conductive film AL1 is not formed between the conductive film AL1 and the semiconductor substrate SUB but the conductive film AL1 is formed directly over the semiconductor substrate SUB.

In the light of crystallography, with regard to a cubic crystal, the (001) surface is equivalent to the (100) surface and a (010) surface as a crystal surface. Therefore, the (001) surface of the conductive film AL1 according to the embodiment is treated as a crystal surface equivalent to the (100) surface disclosed in "zincate Treatment and Electroless Ni—P Plating on Al Single-Crystal Surface," Journal of The Surface Finishing Society of Japan, Vol. 48, No. 8, p. 820-825, 1997. Here, as described in the above-mentioned document, there is a problem that, when the zincate treatment is performed on the (001) surface of the conductive film AL1 in the following step, zinc particles having a relatively large size are deposited, resulting in uneven thickness of the plating film of nickel or the like formed in the following step. This may cause separation between the plating film and the conductive film AL1, thereby reducing reliability of the semiconductor device.

In other words, unless the cleaning treatment is performed as in this embodiment, the thin natural oxide film or the foreign matter is present over the surface of the semiconductor substrate SUB. If the conductive film AL1 is formed in such a state, the conductive film AL1 can hardly take over the crystal surface on the surface of the semiconductor substrate SUB, making it easier for the crystal surface other than the (001) surface to be formed over the surface of the conductive film AL1. However, to reduce resistance of the diode DI, it is desirable to perform the cleaning treatment to remove the thin natural oxide film or the foreign matter. This may make the crystal surface on the surface of the conductive film AL1 configuring the pad electrode PD the (001) surface.

Therefore, the inventors have come up with a method of reducing resistance of the diode DI and making the crystal surface on the surface of the pad electrode PD different from the (001) surface by performing the cleaning treatment.

Figure 4:
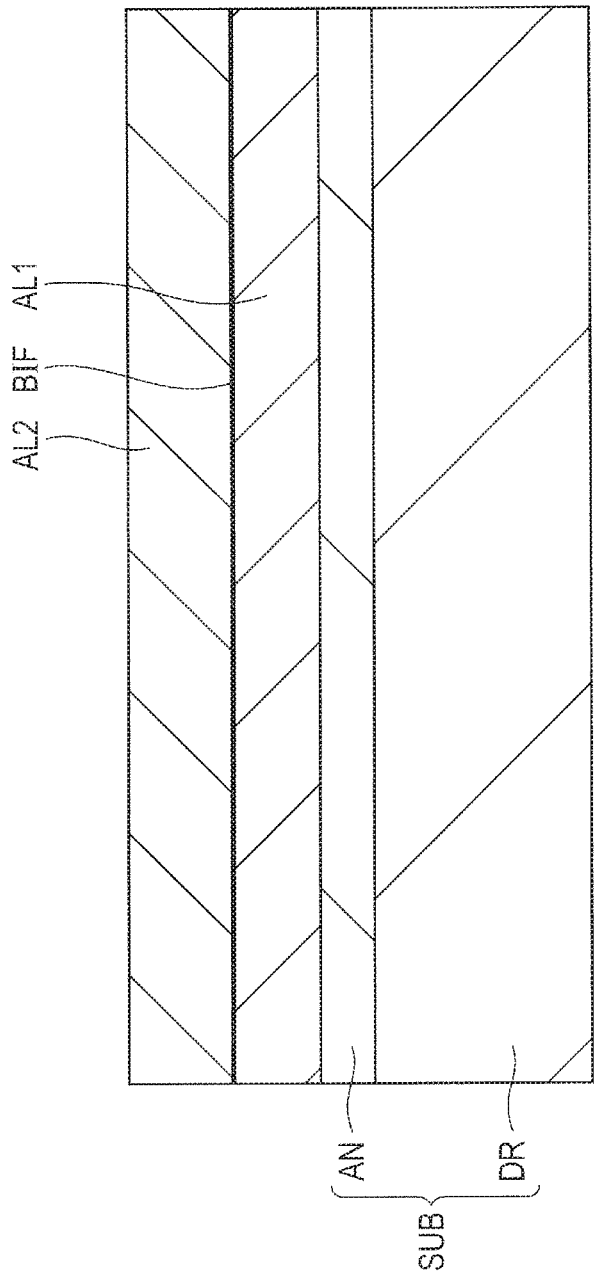
FIG. 4 is a s cross-sectional view of the semiconductor device during the manufacturing process that follows FIG. 3.

FIG. 4 is a cross-sectional view of the method of manufacturing the semiconductor device that follows FIG. 3.

As described with reference to FIG. 3, the crystal surface on the surface of the conductive film AL1 is the (001) surface. In this state, as shown in FIG. 4, an insulating film BIF is formed over the conductive film AL1 first. The insulating film BIF is formed by exposing the surface of the conductive film AL1 to an atmosphere containing oxygen, e.g. by once taking out the semiconductor substrate SUB from a sputtering device and exposing the semiconductor substrate SUB to the atmospheric air at room temperature (23° C.) That is, the insulating film BIF includes an oxide of a material that forms the conductive film AL1, such as aluminum oxide. The thickness of the insulating film BIF ranges from 0.5 nm to 4.0, and more preferably from 1.0 nm to 3.0 nm.

Next, a conductive film AL2 containing mainly aluminum, for example, and also doped with silicon is formed over the insulating film BIF by the sputtering, for example. The thickness of the conductive film AL2 is about 2,500 nm. The temperature for forming the conductive film AL2 by the sputtering is between about the room temperature (23° C.) and 200° C., and more preferably about 150° C.

Now, due to the insulating film BIF formed between the conductive film AL2 and the conductive film AL1, the conductive film AL2 does not take over the (001) surface that is the crystal surface on the surface of the conductive film AL1 and thus it can be formed with the crystal surface different from the (001) surface.

In this embodiment, at the initial stage of forming the conductive film AL2 by the sputtering, the crystal surface on the surface of the conductive film AL2 is predominantly the (111) surface. Specifically, 90% or more of the surface area of the conductive film AL2 is the (111) surface. In this manner, even if the (110) surface remains on a part of the conductive film AL2 after the initial stage of film formation, because particles on the (110) surface are covered by the particles of the (111) surface that configures the most part of the conductive film AL2 in the subsequent stage of film formation by the sputtering, the most part of the surface of the conductive film AL2 eventually becomes the (111) surface. Preferably, 90% or more of the surface of the conductive film AL2 is finally the (111) surface, and more preferably 99% or more of the surface of the conductive film AL2 is finally the (111) surface.

In this manner, by forming the thin insulating film BIF over the surface of the conductive film AL1 having the (100) crystal surface, the crystal surface on the surface of the conductive film AL2 to be the surface of the pad electrode PD can be the (111) surface. That is, the insulating film BIF is an orientation blocking film serving as a film for blocking orientation of crystal.

Although the embodiment shows the pad electrode PD having a two-layer structure of the conductive film AL1 and the conductive film AL2, the pad electrode PD may have three or more layers by further forming an insulating film such as the insulating film BIF over the conductive film AL2 and subsequently forming a conductive film such as the conductive film AL2 thereon.

Moreover, as described above, the thickness of the insulating film BIF is no less than 0.5 nm and no more than 4.0 nm, and more preferably no less than 1.0 nm and no more than 3.0 nm. This is the thickness range for the conductive film AL2 not to take over the crystal surface of the conductive film AL1 and for sufficient conductivity to be guaranteed between the conductive film AL2 and the conductive film AL1. That is, because voltage of millions of volts is applied to such a diode DI as described in this embodiment, the insulating film BIF having the thickness as described above does not affect properties of the diode DI.

Figure 5:
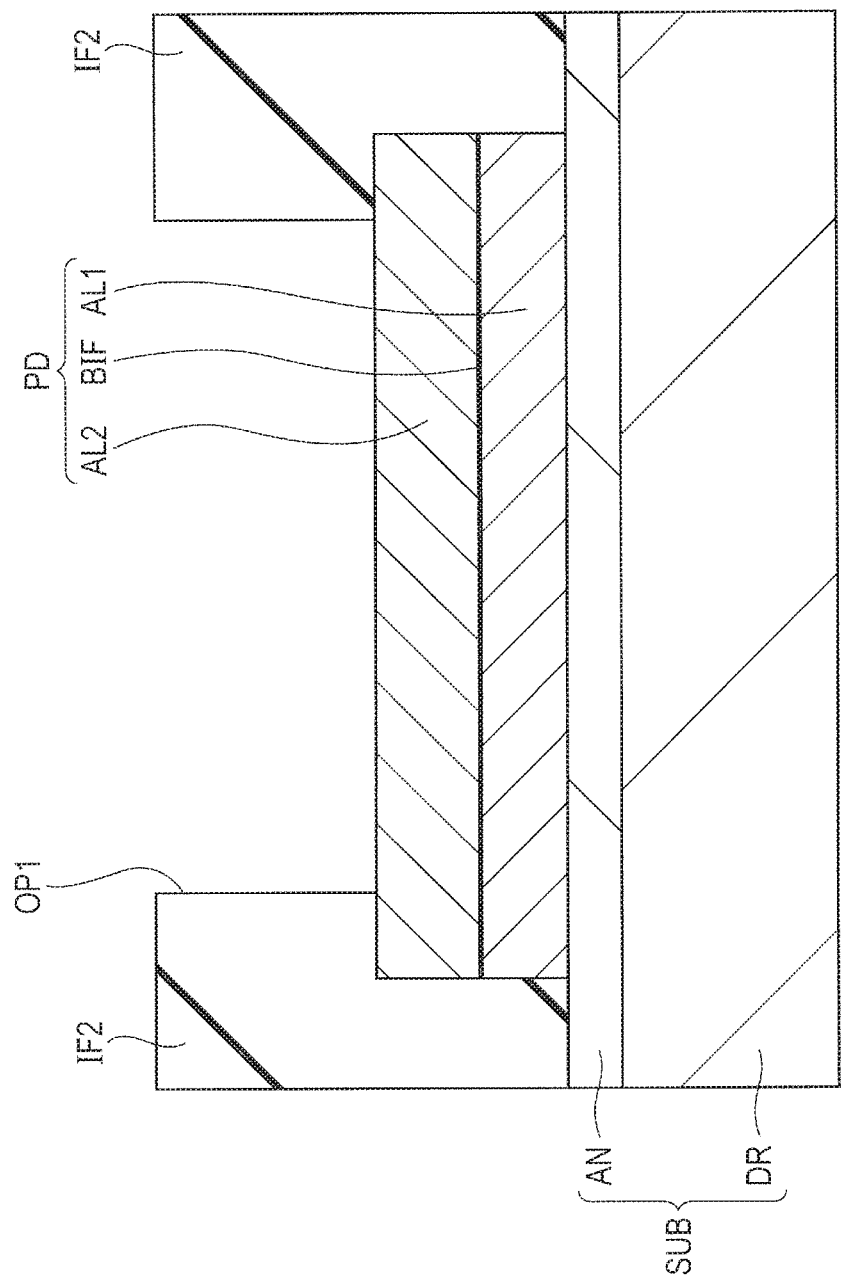
FIG. 5 is a s cross-sectional view of the semiconductor device during the manufacturing process that follows FIG. 4.

Next, as shown in FIG. 5, the pad electrode PD containing mainly the conductive film AL2 and the conductive film AL1 is formed by patterning the conductive film AL2, the insulating film BIF, and the conductive film AL1 using photolithography and dry etching.

An insulating film IF2 including an organic resin such as photosensitive polyimide is then formed over the semiconductor substrate SUB so as to cover the pad electrode PD. Then, an opening OP1 exposing a part of the pad electrode PD is formed over the insulating film IF2 by selectively exposing the insulating film IF2 to light. It is to be noted that a material for the insulating film IF2 may be inorganic insulating film such as silicon oxide or silicon nitride instead of the organic resin described above.

Figure 6:
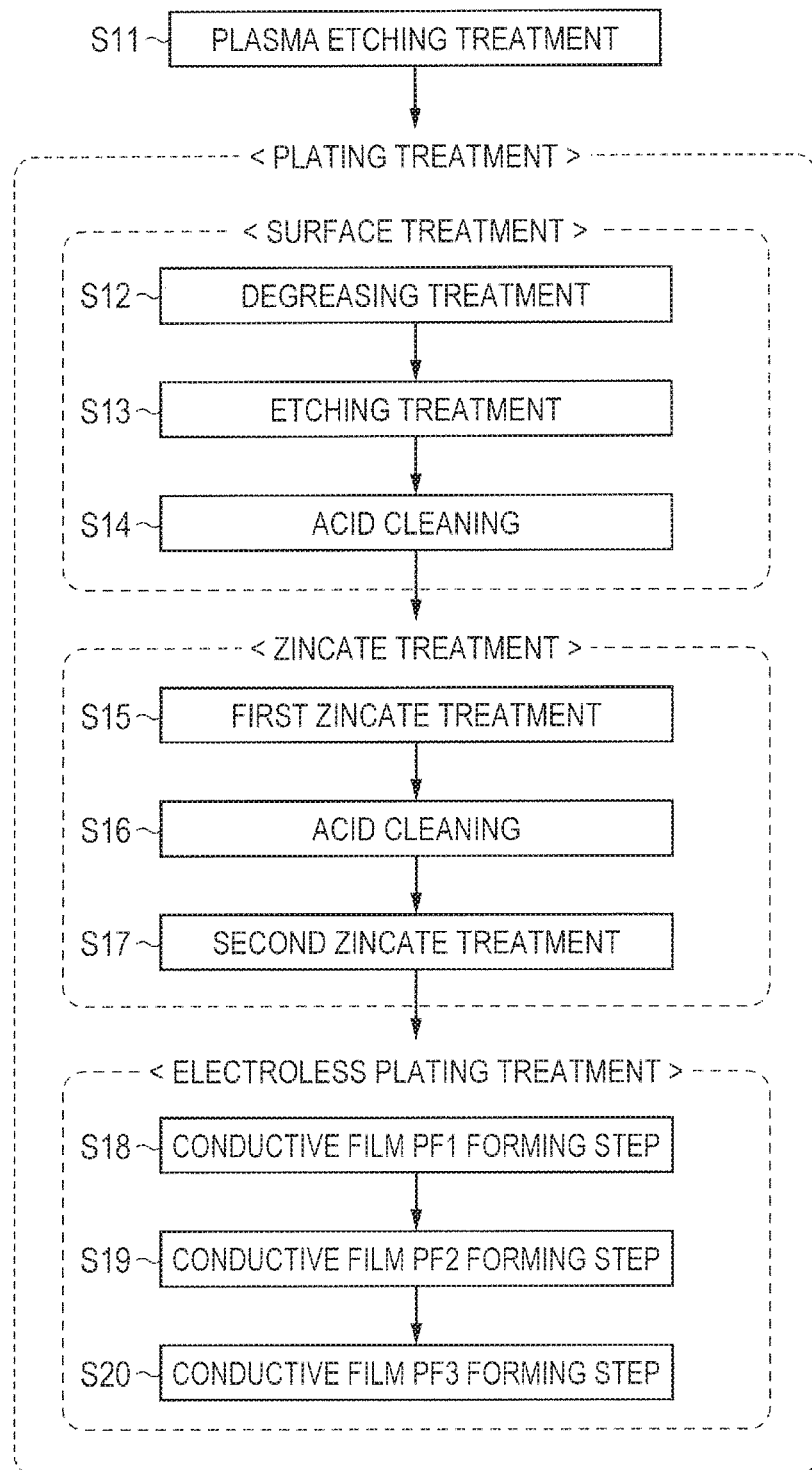
FIG. 6 shows a process flow indicative of the manufacturing process of the semiconductor device that follows FIG. 5.

FIG. 6 illustrates a process flow to the step at which a conductive layer OPM is formed as in FIG. 7 to be described later, showing a plasma etching treatment S11 and plating treatments S12 to S20 to be performed on the pad electrode PD. In this embodiment, the plating treatment is described to include surface treatments S12 to S14, zincate treatments S15 to S17, and electroless plating treatments S18 to S20. After each process at S12 to S20, a pure water cleaning treatment may be performed.

Before conductive films PF1 to PF3 that are plating films are formed over the pad electrode PD by the electroless plating treatments S18 to S20, the plasma etching treatment S11 and the surface treatments S12 to S14 are performed on the surface of the pad electrode PD. The plasma etching treatment S11 and the surface treatments S12 to S14 are performed to remove the natural oxide film, the grease, the foreign matter, and the like present over the surface of the pad electrode PD.

As indicated at Step S11 in FIG. 6, the plasma etching treatment is performed first on the surface of the conductive film AL2 using inert gas such as argon (Ar). The natural oxide film over the surface of the conductive film AL2 is removed by the plasma etching treatment.

Next, the plating treatment is performed on the surface of the conductive film AL2 in the order of surface treatments S12 to S14, zincate treatments S15 to S17, and electroless plating treatments S18 to S20.

As indicated at Step S12 in FIG. 6, the degreasing treatment is performed on the surface of the conductive film AL2 using a weak alkaline aqueous solution containing sodium hydroxide or the like. The grease over the surface of the conductive film AL2 and the natural oxide film over the surface of the conductive film AL2 are primarily removed by the degreasing treatment.

Next, as indicated at Step S13 in FIG. 6, the etching treatment is performed using an alkaline aqueous solution containing, for example, copper (Cu). The etching treatment is performed to remove aluminum oxide present near the surface of the conductive film AL2, and it is effective where the conductive film AL2 is made of aluminum doped with silicon as in this embodiment. That is, by dissolving aluminum oxide present near the surface of the conductive film AL2 with the alkaline aqueous solution and substituting the aluminum surface with copper having a standard electrode potential higher than that of aluminum, it is possible to effectively reduce aluminum oxide present near the surface of the conductive film AL2.

Next, as indicated at Step S14 in FIG. 6, an acid cleaning is performed on the surface of the conductive film AL2 using an aqueous solution containing, for example, nitric acid. The acid cleaning allows for the copper substituted at Step S13 to be dissolved in the aqueous solution containing nitric acid and for removing copper from the surface of the conductive film AL2.

Next, as indicated at Step S15 in FIG. 6, a first zincate treatment is performed on the surface of the conductive film AL2.

As disclosed in "Zincate Treatment and Electroless Ni—P Plating on Al Single-Crystal Surface," Journal of The Surface Finishing Society of Japan, Vol. 48, No. 8, p. 820-825, 1997, if ever the surface of the conductive film AL2 is (001) surface, growth of the zinc particles would be less even and its size may further increase.

Next, as indicated at Step S16 in FIG. 6, the acid cleaning is performed on the surface of the conductive film AL2. For example, by using the aqueous solution containing nitric acid, zinc particles deposited by the first zincate treatment is dissolved in the aqueous solution containing nitric acid. This treatment allows aluminum to appear uniformly on the surface of the conductive film AL2.

Next, as indicated at Step S17 in FIG. 6, a second zincate treatment is performed on the surface of the conductive film AL2. This makes the zinc particles deposited onto aluminum again. A dense and uniform Zn film can be formed by repeating the zincate treatment two times. This allows the plating film of nickel or the like that will be formed in the following step to be deposited uniformly.

Figure 7:
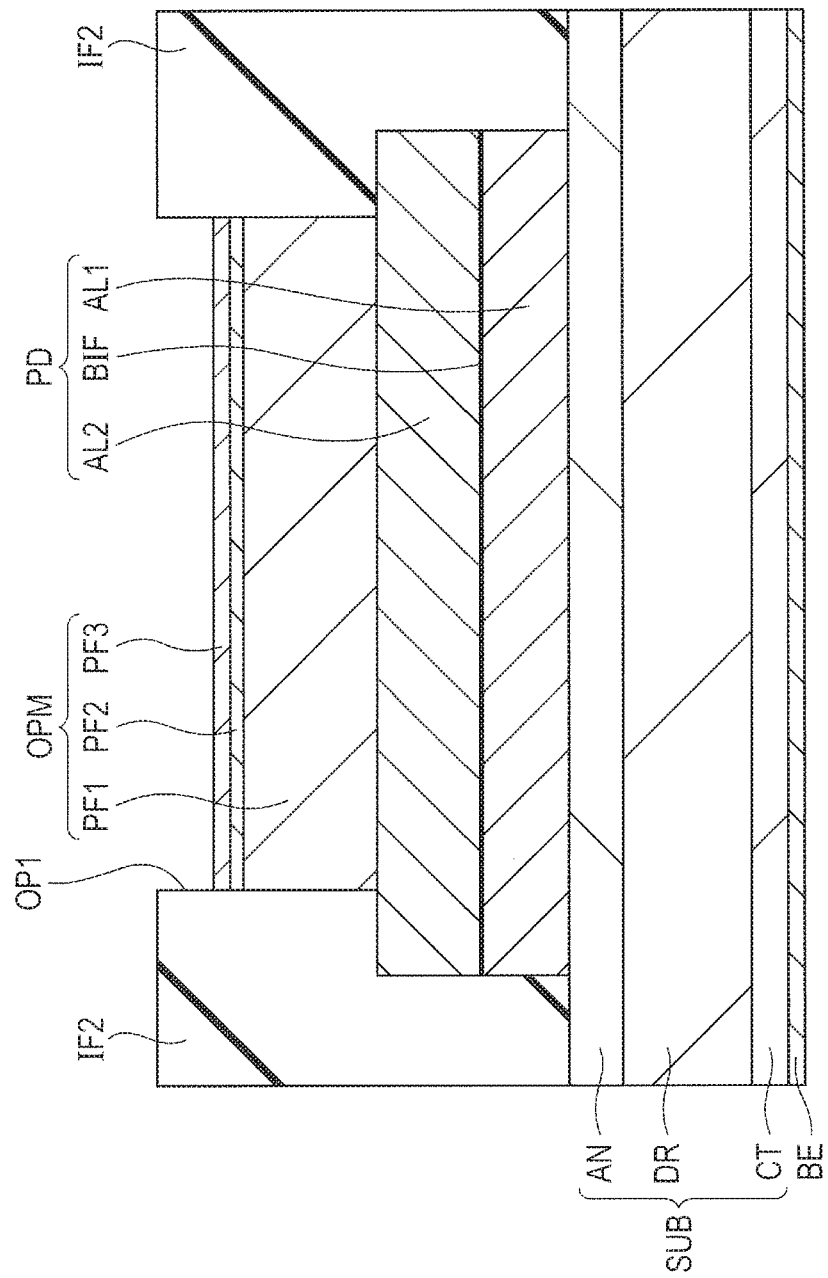
FIG. 7 is a cross-sectional view of the semiconductor device during the manufacturing process that follows FIG. 6.

Next, as indicated at Steps S18 to S20 in FIG. 6 and in FIG. 7, the electroless plating treatment is performed on the surface of the pad electrode PD, thereby sequentially forming the conductive films PF1 to PF3.

First, as indicated at Step S18 in FIG. 6, the conductive film PF1 containing mainly nickel (Ni) or the like is formed over the exposed surface of the pad electrode PD (surface of the conductive film AL2) by electroless plating. To form the conductive film PF1, the surface of the conductive film AL2 is immersed in plating aqueous solution containing nickel ion or the like. At this time, the zinc particles deposited by the zincate treatment in FIG. 6 are dissolved into the plating aqueous solution. At the same time, nickel is reduced and deposited by electrons emitted from the zinc particles. That is, in the region where the zinc particles are deposited, nickel is reduced and deposited and the plating film grows using the deposited nickel as catalyst, thereby forming the conductive film PF1. As described above, because the size of each zinc particle is small and constant, the substituted and deposited nickel film also grow uniformly. Thus, it is possible to improve uniformity of the thickness of the conductive film PF1.

Then, as indicated at Steps S19 and S20, by sequentially forming the conductive film PF2 containing mainly palladium (Pd) or the like and the conductive film PF3 containing mainly gold (Au) over the conductive film PF1 by electroless plating, the conductive layer OPM including a lamination of the plating films. Because the conductive film PF2 and the conductive film PF3 are formed over the conductive film PF1 having highly uniform thickness, the conductive film PF2 and the conductive film PF3 are also formed with highly uniform thickness. Thus, it is possible to improve uniformity of thickness of the conductive layer OPM.

It is to be noted that the thickness of the conductive film PF1 is about 1,000 to 4,000 nm, the thickness of the conductive film PF2 is about 100 to 400 nm, and the thickness of the conductive film PF3 is about 30 to 200 nm.

Because the conductive film PF1 is a principal film of the conductive layer OPM, it is preferable to include a material having low sheet resistance. The conductive film PF3 is provided mainly to improve adhesiveness with an external connection terminal TR, and it is preferable to include a material having higher adhesiveness to the external connection terminal TR than the conductive film PF1. The conductive film PF2 is provided to prevent that the conductive film PF1 be diffused over the surface of the conductive film PF3 to corrode a boundary between the conductive film PF1 and the conductive film PF3.

Moreover, the conductive layer OPM may be a lamination of the conductive film PF1 and the conductive film PF3 or a lamination of the conductive film PF1 and the conductive film PF2. Furthermore, the conductive film PF1 and the conductive film PF2 may contain phosphorus (P).

In this manner, the conductive layer OPM including a plating film is formed over the pad electrode PD. It is to be noted that the conductive layer OPM configures an anode electrode of the diode DI.

Next, a cathode region CT and a back electrode BE are formed on the back side of the semiconductor substrate SUB.

First, the back side of the semiconductor substrate SUB is polished to reduce the thickness of the semiconductor substrate SUB. Next, an n-type impurity is introduced from the back side of the semiconductor substrate SUB using ion implantation to form the cathode region CT having a higher impurity concentration than that of the drift region DR. Subsequently, the introduced impurity is activated by heat treatment. Then, metal films including nickel (Ni), titanium (Ti), gold (Au), for example, are deposited in this order from the side abutting the cathode region CT using sputtering, thereby forming a cathode electrode (back electrode) BE including these metal films.

The semiconductor device according to the embodiment is manufactured in the above-mentioned steps.

Figure 8:
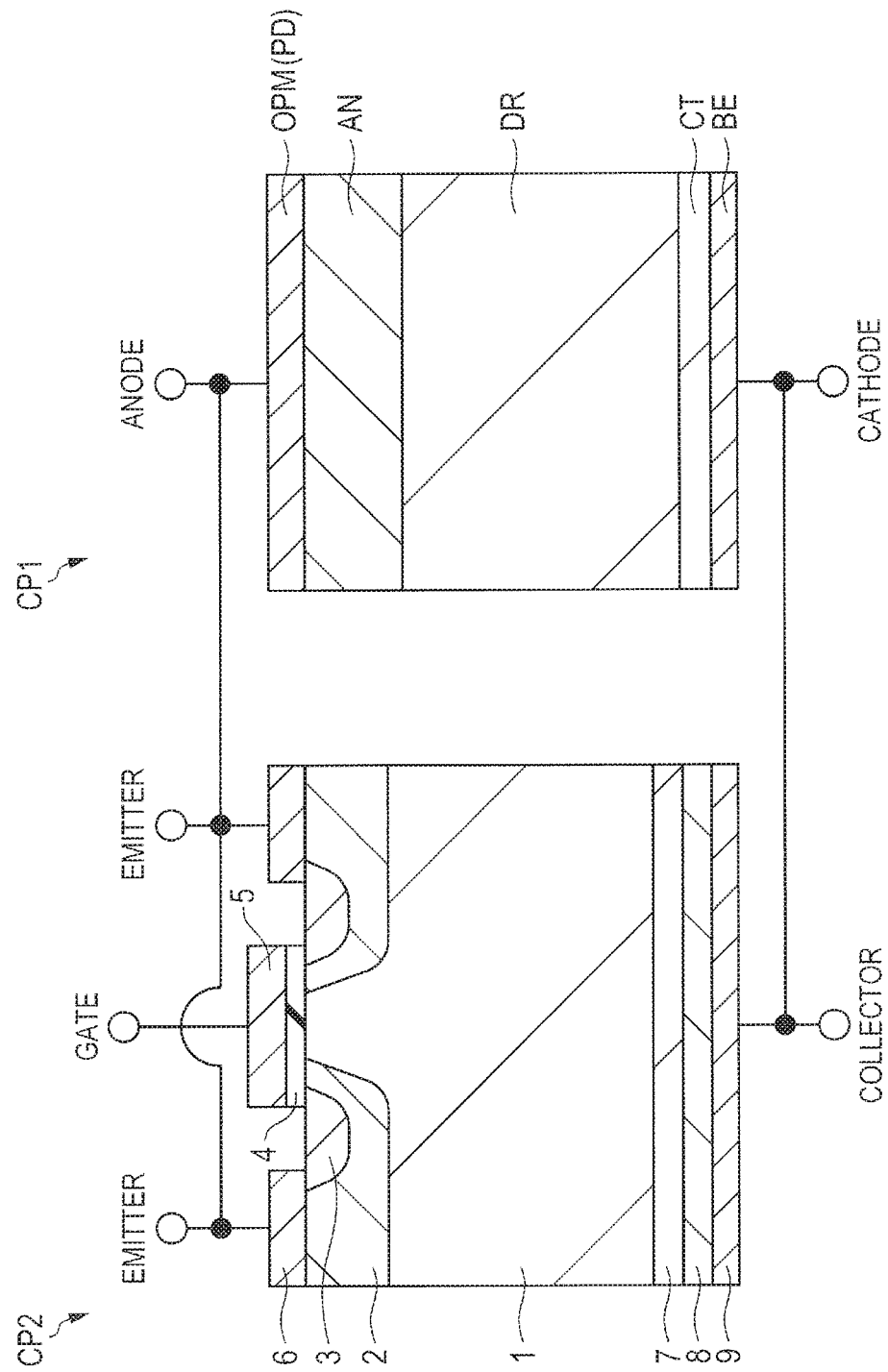
FIG. 8 is a schematic view of the semiconductor device according to the first embodiment and an IGBT in a modularized form.

FIG. 8 is a schematic view showing one configuration in which a semiconductor wafer having the semiconductor device according to the embodiment formed thereon is diced into a chip CP1 by a dicing step of a post-processing treatment and then the semiconductor element including the diode DI according to the embodiment and an IGBT is modularized. In the schematic view, dimensions of configurations such as the conductive layer OPM are different from those described with reference to FIG. 7.

In FIG. 8, the chip CP1 is the semiconductor device including the diode DI according to the embodiment formed thereon, and a chip CP2 is the semiconductor device including the semiconductor element of IGBT formed thereon.

The IGBT includes a configuration shown on the left side of FIG. 8. As shown in FIG. 8, a p-type base layer 2 is formed over the surface of then-type semiconductor substrate that configures a drift region 1. Formed over the surface of the base layer 2 is an n-type source layer 3, and the base layer 2 and the source layer 3 are coupled commonly to an emitter electrode including an aluminum film or the like. The base layer 2 arranged between the drift region 1 and the source layer 3 is a channel region, and a gate electrode 5 is formed over the channel region via a gate insulating film 4. Formed over the back side of the drift region 1 are a buffer layer 7 doped with an n-type impurity, an emitter layer 8 doped with a p-type impurity, and a collector electrode 9.

Moreover, as shown in FIG. 8, the cathode electrode BE of the diode DI and the collector electrode 9 of the IGBT are electrically coupled to each other, and the anode electrode (conductive layer) OPM of the diode DI and the emitter electrode 6 of the IGBT are also electrically coupled to each other.

Figure 9:
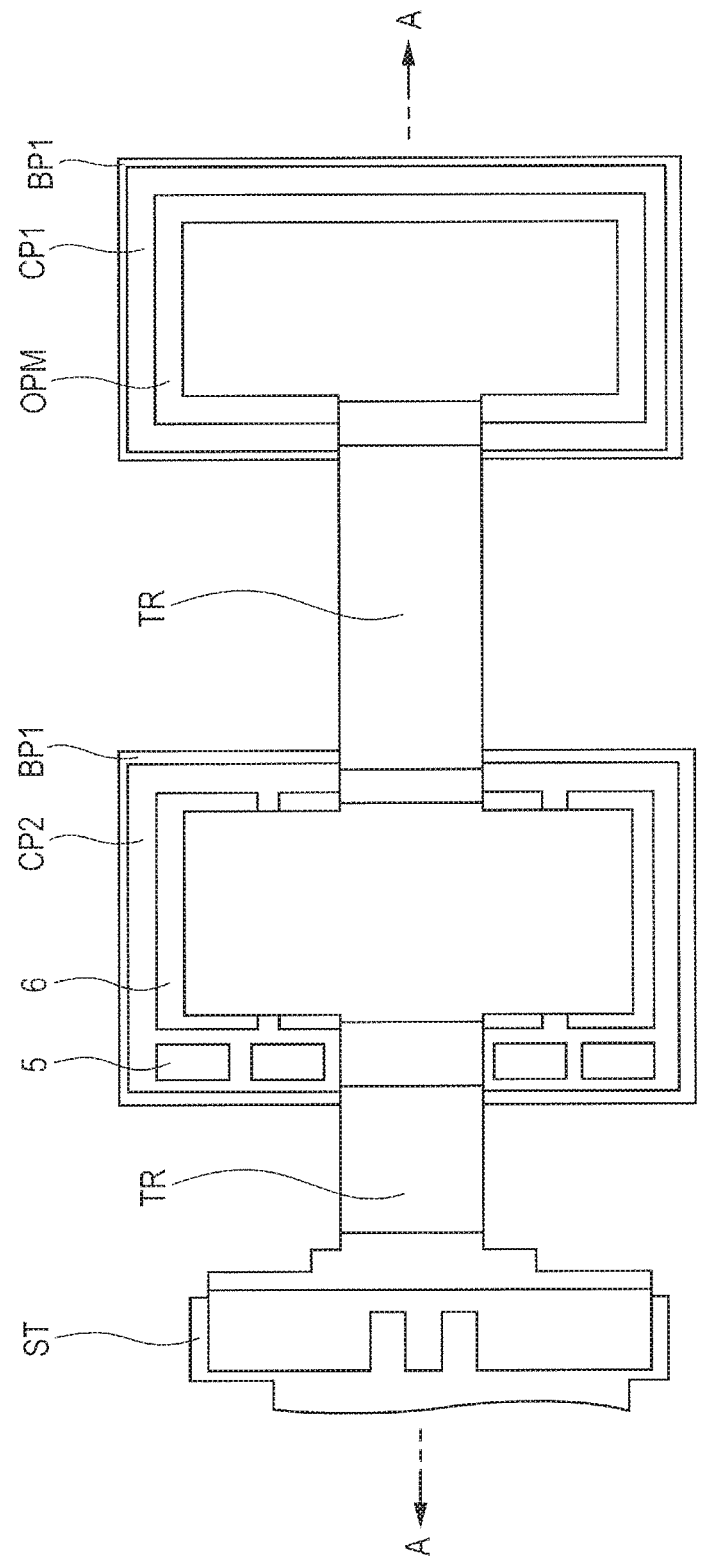
FIG. 9 is a plan view showing the semiconductor device of FIG. 8 in a mounted state.
Figure 10:
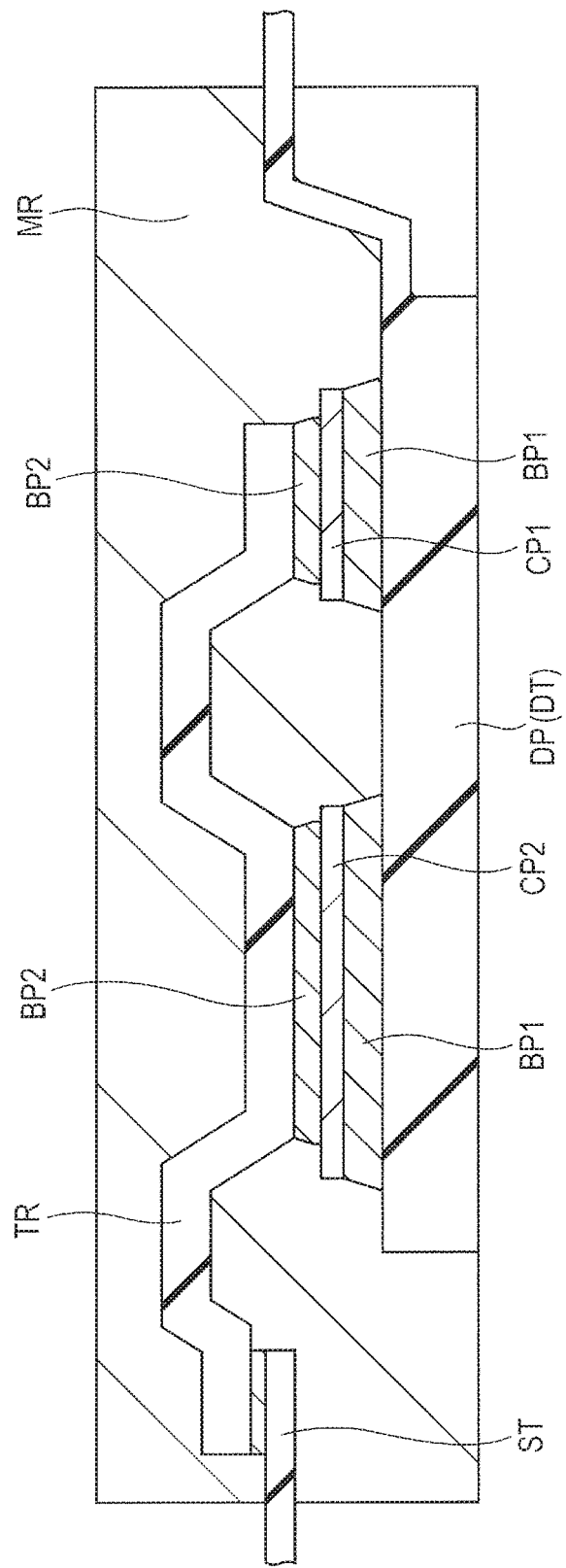
FIG. 10 is a cross-sectional view taken along a line A-Ain FIG. 9.

FIGS. 9 and 10 show an example in which the chip CP1 and the chip CP2 configuring the IGBT shown in FIG. 8 are packaged. FIG. 10 is a cross-sectional view taken along line A-A in the plan view shown in FIG. 9. It is to be noted that a sealing resin MR and a die pad DP depicted in FIG. 10 are omitted in FIG. 9 for better understanding of the shape of the external connection terminal TR. It is illustrated here that the chip CP1 and the chip CP2 are coupled in a single package using a clip including, for example, a copper sheet, as an example of the external connection terminal TR.

As shown in FIGS. 9 and 10, the chip CP1 and the chip CP2 are mounted over the die pad DP via a solder BP1. The die pad DP also serves as a power source potential terminal DT that supplies power source potential to the chip CP1 and the chip CP2. That is, the cathode electrode BE of the chip CP1 and the collector electrode 9 of the chip CP2 are electrically coupled to the power source potential terminal DT (die pad DP) via the solder BP1.

Moreover, the external connection terminal TR is coupled to the CP1 and the chip CP2 via a solder BP2. The external connection terminal TR is electrically coupled to the ground potential terminal ST via a conductive adhesive or the like. The conductive layer OPM of the chip CP1 is coupled to the solder BP2. That is, the anode electrode (conductive layer) OPM of the chip CP1 and the emitter electrode 6 of the chip CP2 are electrically coupled to the ground potential terminal ST via the solder BP2 and the external connection terminal TR.

Although detailed explanation is not provided, the gate electrode 5 of the IGBT is coupled to another terminal via a bonding wire or the like other than the external connection terminal TR.

The chip CP1 and the chip CP2 coupled to the die pad DP and the external connection terminal TR are sealed with the sealing resin MR. In this manner, the semiconductor device according to the embodiment is packaged.

Moreover, the external connection terminal TR may be a bonding wire including copper or gold. However, for such a semiconductor device that has a large area of the anode electrode (conductive layer) OPM of the diode DI and a large area of the emitter electrode 6 of the IGBT and that is to receive voltage of hundreds of volts as in the embodiment, it is desirable to use a copper clip having a large area to reduce resistance related to coupling to another chip. It is also possible to use sintered silver (Ag) instead of the solders BP1, BP2.

Herein below, main features of the embodiment are briefly summarized. The embodiment is characterized in that the crystal surface on the surface of the conductive film AL2 is formed with the crystal surface different from that of the crystal surface on the surface of the conductive film AL1.

For example, when the crystal surface on the surface of the pad electrode PD is formed with the (001) surface, in the first and second zincate treatments in FIG. 6, there is a problem that the size of the deposited zinc particle is so large that the deposition of the plating film such as nickel formed by the electroless plating cannot be performed uniformly and the surface of the plating film becomes rough. Thus, moisture or the like enters the interface between the pad electrode PD and the conductive layer OPM facilitating separation in this portion, which reduces reliability of the semiconductor device. Furthermore, appearance abnormality is observed on the surface of the plating film.

To the contrary, in this embodiment, by forming the thin insulating film BIF over the conductive film AL1 having the (001) surface, the conductive film AL2 formed over the insulating film BIF is not affected by the crystal surface on the surface of the conductive film AL1, allowing the he crystal surface on the surface of the conductive film AL2 to have the (111) surface. Thus, because the size of each zinc particle deposited during the first and second zincate treatments shown in FIG. 6 is uniform and small, the deposit from the conductive film PF1 including nickel and the like formed by electroless plating can be formed relatively uniformly. This allows for a configuration in which separation is hardly caused on the interface between the pad electrode PD and the conductive layer OPM, thereby improving reliability of the semiconductor device. Furthermore, appearance abnormality on the surface of the plating film can be minimized.

Especially, in this embodiment, the cleaning treatment is performed on the semiconductor substrate SUB serving as the base of the conductive film AL1 to keep the surface of the semiconductor substrate SUB clean. This reduces the contact resistance between the semiconductor substrate SUB and the conductive film AL1, thereby reducing resistance of the diode DI. However, because the conductive film AL1 tends to take over the (001) surface that is the crystal surface on the surface of the semiconductor substrate SUB, the crystal surface on the surface of the conductive film AL1 also tends to have the (001) surface. Here, by forming the conductive film AL2 over the conductive film AL1 via the insulating film BIF as described above, the crystal surface on the surface of the conductive film AL2 may have the (111) surface, which achieves the structure in which separation is hardly caused on the interface between the pad electrode PD and the conductive layer OPM. That is, using the technique of the embodiment can improve performance of the semiconductor device and also improve reliability of the semiconductor device.

First Modification of First Embodiment

In the first embodiment, the insulating film BIF is formed over the conductive film AL1 by once taking out the semiconductor substrate SUB from the sputtering device and exposing it to the atmospheric air, as shown in FIG. 4.

To the contrary, according to a first modification, the semiconductor substrate SUB is transferred to another chamber without taking it out of the sputtering device, an oxygen-containing gas is introduced into the sputtering device, and the surface of the conductive film AL1 is exposed to oxygen atmosphere, thereby forming the insulating film BIF. Specifically, exposure to such oxygen atmosphere is performed in oxygen gas atmosphere at room temperature. The oxidation treatment may be combined with heat treatment, and may be conducted by emitting plasma using oxygen gas.

Subsequently, the conductive film AL2 is formed over the insulating film BIF by the sputtering as in the first embodiment, without taking out the semiconductor substrate SUB from the sputtering device.

In this manner, because there is no need of taking out the semiconductor substrate SUB from the sputtering device to form the insulating film BIF, it is possible to perform the next step of forming the conductive film AL2 immediately. Thus, compared with the first embodiment, it is possible to simplify the process of manufacturing the semiconductor device.

Second Modification of First Embodiment

In the first embodiment, the conductive film AL2 is configured using the same material as that of the conductive film AL1, the material containing mainly, for example, aluminum doped with silicon.

To the contrary, in a second modification, the conductive film AL2 is configured using a material different from that of the conductive film AL1, the material containing mainly, for example, aluminum doped with copper. That is, the element doped into the conductive film AL2 is different from the element doped into the conductive film AL1.

The conductive film AL1 is in direct contact with the diode DI and made of aluminum film doped with silicon for the purpose of reducing spike shapes on the interface between the semiconductor substrate SUB and the conductive film AL1. However, because the conductive film AL2 is not in direct contact with the diode DI, the material of the conductive film AL2 may be other material than the aluminum film doped with silicon. Here, because the copper-doped aluminum film exhibits better electromigration than the silicon-doped aluminum film, the copper doped aluminum film is used as the conductive film AL2 of the second modification.

Moreover, by using the copper-doped aluminum film as the conductive film AL2, the etching treatment at Step S13 in FIG. 6 can be omitted. That is, the aluminum oxide present over the surface of the conductive film AL2 is substituted using the aqueous solution containing copper having high standard electrode potential at Step S13 described above. However, in the second modification, copper is already included in the conductive film AL2. Therefore, it is possible to more effectively remove the oxide over the surface of the conductive film AL2 by the degreasing treatment using the alkaline aqueous solution at Step S12 or the subsequent zincate treatment. The zincate treatment further facilitates deposition of the zinc particles, and the electroless plating treatment further facilitates substitute and deposit nickel. Thus, because Step S13 shown in FIG. 6 can be omitted in the second modification, the method of manufacturing the semiconductor device can be simplified.

Furthermore, the conductive film AL2 may be made of a material containing mainly aluminum and doped with copper and silicon. It is to be noted that the technique disclosed in the second modification is also applicable to the above-mentioned first modification.

Second Embodiment

In the first embodiment, the insulating film BIF is formed over the conductive film AL1 to differentiate the crystal surface of the conductive film AL2 from that of the conductive film AL1.

To the contrary, in the second embodiment, formed over the conductive film AL1 is an amorphous film that is a conductive film made of a material different from that of the conductive film AL1 and in an amorphous state over the conductive film AL1. It is to be noted that the amorphous film a replacement from the insulating film BIF in the first embodiment and therefore it is not presented in the drawings. In other words, the reference symbol "BIF" indicated in FIG. 4 or the like designates the amorphous film.

Such an amorphous film is formed by sputtering or CVD and configured by a film containing mainly, for example, tantalum, titanium nitride, or tungsten nitride. Moreover, the thickness of the amorphous film is between 0.5 nm and 4.0 nm, and more preferably between 1.0 nm and 3.0 nm. That is, the above-mentioned material can exist in the amorphous state as long as it has such a small film thickness. Because the amorphous film is in the amorphous state, it does not have a specific crystal surface. Therefore, when the conductive film AL2 is formed over the amorphous film by sputtering, the conductive film AL2 does not take over the crystal surface of the conductive film AL1 but grows mainly based on the (111) surface, as in the first embodiment. That is, the amorphous film is an orientation blocking film serving as a film for blocking orientation of crystal, like the insulating film BIF. Thus, the semiconductor device according to the second embodiment can provide the same effect as the first embodiment.

It is to be noted that the second modification of the first embodiment described above can be applied to the technique disclosed in the second embodiment.

Third Embodiment

In a third embodiment, the conductive film AL1 and the conductive film AL2 used in the first embodiment are applied to wiring of a power MOS. Here, as an example of the wiring of the power MOS, a case is described in which the conductive film AL1 and the conductive film AL2 are applied to a source electrode SPD.

A structure of the semiconductor device according to the third embodiment and a method of manufacturing the same are described below with reference to FIGS. 11 to 13.

Figure 11:
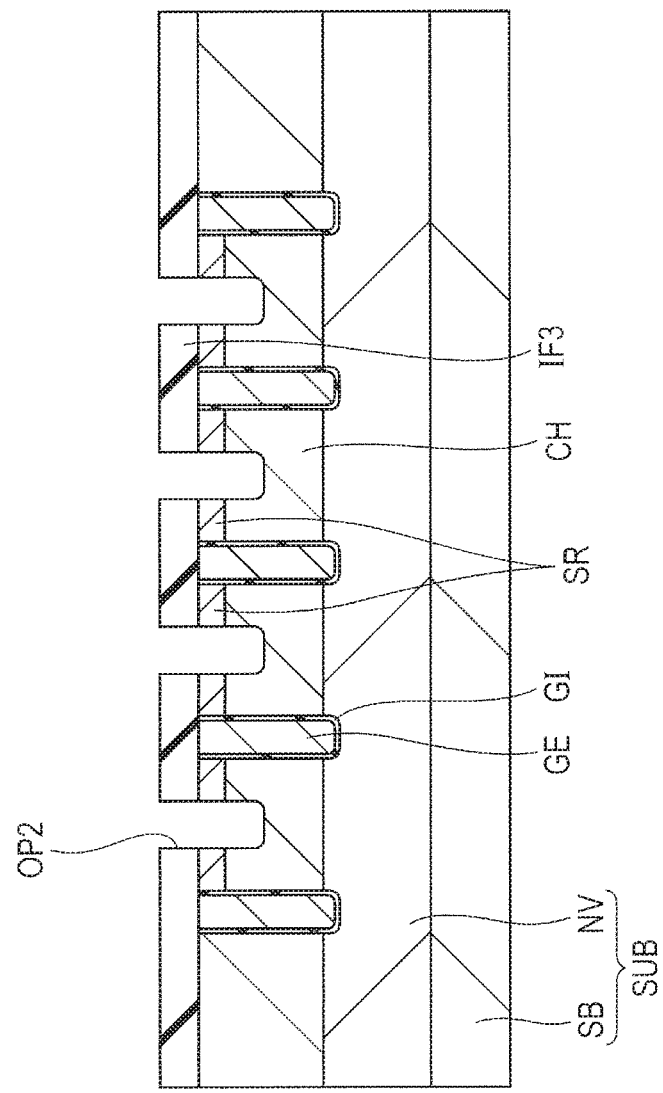
FIG. 11 is a cross-sectional view of a main part of the semiconductor device of a third embodiment.

FIG. 11 shows an n-type power MOS including an n-type gate electrode GE, a gate insulating film GI, an insulating film IF3 that covers the gate electrode GE, a p-type channel region CH, an n-type source region SR, an n-type drift region NV serving as a drain region, and an n-type substrate SB.

An example method of manufacturing such a power MOS is described below.

The substrate SB having n-type conductivity and including semiconductor such as silicon is prepared first. Next, a drift region NV (impurity region NV) having n-type conductivity and impurity concentration lower than that of the substrate SB is formed over the substrate SB by epitaxy or the like. In this embodiment, explanation is given assuming a structure including the substrate SB and the drift region NV as the semiconductor substrate SUB.

After forming a groove in the drift region NV, a gate insulating film GI including silicon oxide is formed over the side face and the bottom face of the groove. Next, the gate electrode GE including polycrystalline silicon or the like is formed over the gate insulating film GI so as to fill the groove. Then, the channel region CH having p-type conductivity is formed on top of the drift region NV by ion implantation. A boundary between the channel region CH and the drift region NV is located above the bottom face of the gate electrode GE. The source region SR (impurity region SR) having n-type conductivity is then formed on top of the channel region CH by ion implantation. The insulating film IF3 is then selectively formed over a portion of the source region SR and over the gate electrode GE. Next, by performing dry etching on a portion exposed on the insulating film IF3, an opening OP2 reaching the channel region CH through the source region SR is formed. Then-type power MOS is manufactured as described above.

Figure 12:
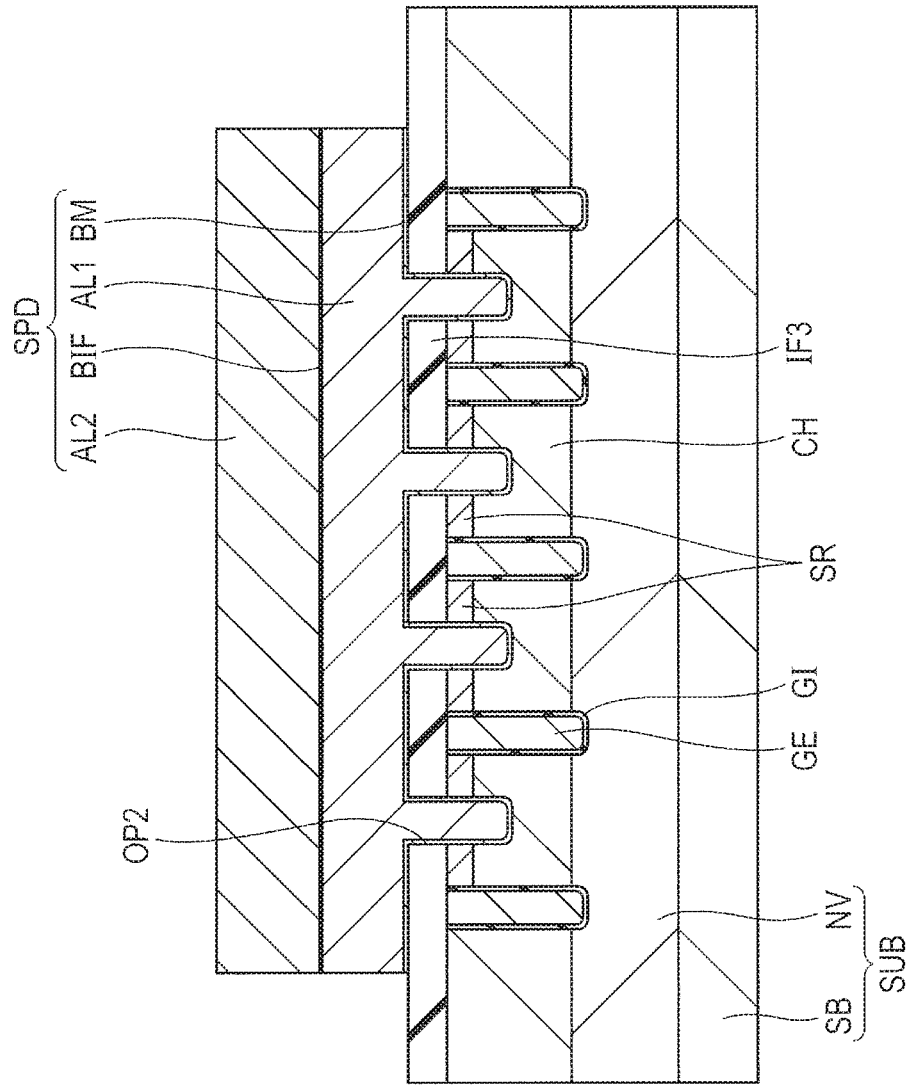
FIG. 12 is a cross-sectional view of the semiconductor device during the manufacturing process that follows FIG. 11.

Next, as shown in FIG. 12, the conductive film AL1 and the conductive film AL2 serving as the source electrode SPD are formed over the insulating film IF3.

First, a barrier metal film BM including titanium tungsten (TiW), titanium nitride (TiN), or the like is formed in the opening OP2 and over the insulating film IF3. Then, the conductive film AL1 containing mainly aluminum, for example, is formed over the barrier metal film BM so as to fill the opening OP2. This allows the conductive film AL1 serving as a part of the source electrode SPD to be electrically coupled to the source region SR and the channel region CH.

It is to be noted that, in the third embodiment, the barrier metal film BM is formed between the semiconductor substrate SUB and the conductive film AL1 unlike the first embodiment and the second embodiment described above. Accordingly, the conductive film AL1 may use a material mainly containing aluminum and doped with silicon or a material mainly containing aluminum and doped with copper.

Here, the conductive film AL1 is formed by sputtering, and the maximum temperature in the forming process ranges from 250 to 400 degrees, which is higher than that in the first embodiment. This is to prevent a void formed in the conductive film AL1 when the conductive film AL1 is filled in the opening OP2. The formation of the conductive film AL1 may be performed in two steps including an initial film formation performed at a low temperature ranging from room temperature (23° C.) to 200° C. and a second step performed at a high temperature ranging from 250 to 400° C. for filling. Moreover, a step is made between the surface of the conductive film AL1 located on top of the opening OP2 and the surface of the conductive film AL1 located on top of the gate electrode GE. To minimize the step to make the entire surface of the conductive film AL1 as flat as possible, it is effective to form the conductive film AL1 at high temperature. For the semiconductor device according to this embodiment, the conductive layer OPM is formed over the source electrode SPD in a later step. Thus, by eliminating any void in the conductive film AL1 serving as a part of the source electrode SPD and flattening its surface, it is possible to make the thickness of the conductive layer OPM more uniform.

In such an aluminum film formed at relatively high temperature, however, the size of the aluminum particle tends to be larger compared with an aluminum film formed at relatively low temperature as in the first embodiment. That is, the crystal surface on the surface of the conductive film AL1 tends to have not only the (111) surface but also the (001) surface. Thus, if the conductive layer OPM is formed over the conductive film AL1, separation would easily occur between the source electrode SPD and the conductive layer OPM as in the first embodiment.

Therefore, in the third embodiment, the thin insulating film BIF is formed over the conductive film AL1 and then the conductive film AL2 is formed over the conductive film AL1 as in the first embodiment. This can differentiate the crystal surface on the surface of the conductive film AL2 from the crystal surface on the surface of the conductive film AL1. It is to be noted that the method of forming the insulating film BIF and the conductive film AL2 is the same as that in the first embodiment. Accordingly, the crystal surface on the surface of the conductive film AL2 in this embodiment is also the (111) surface.

In this embodiment, the temperature of formation of the conductive film AL2 is lower than that of the conductive film AL1, and it is about room temperature (23° C.) to 200° C., for example, and more preferably about 150° C. That is, because the conductive film AL1 is formed at relatively high temperature, the flatness of its surface is improved whereas the possibility of generating the (001) surface having a large particle size also increases. Therefore, generation of the (001) surface having the large particle size can be suppressed by forming the conductive film AL2 at relatively low temperature. In other words, in the third embodiment, the area ratio of the (111) surface on the surface of the conductive film AL2 is higher than that of the (111) surface on the surface of the conductive film AL1.

Then, the source electrode SPD shown in FIG. 12 is formed by patterning the conductive film AL2, the insulating film BIF, the conductive film AL1, and the barrier metal film BM using photolithography and dry etching. It is to be noted that a gate pad electrode GPD to be coupled to the gate electrode GE of the power MOS is also formed at this time (not shown in the figure).

Figure 13:
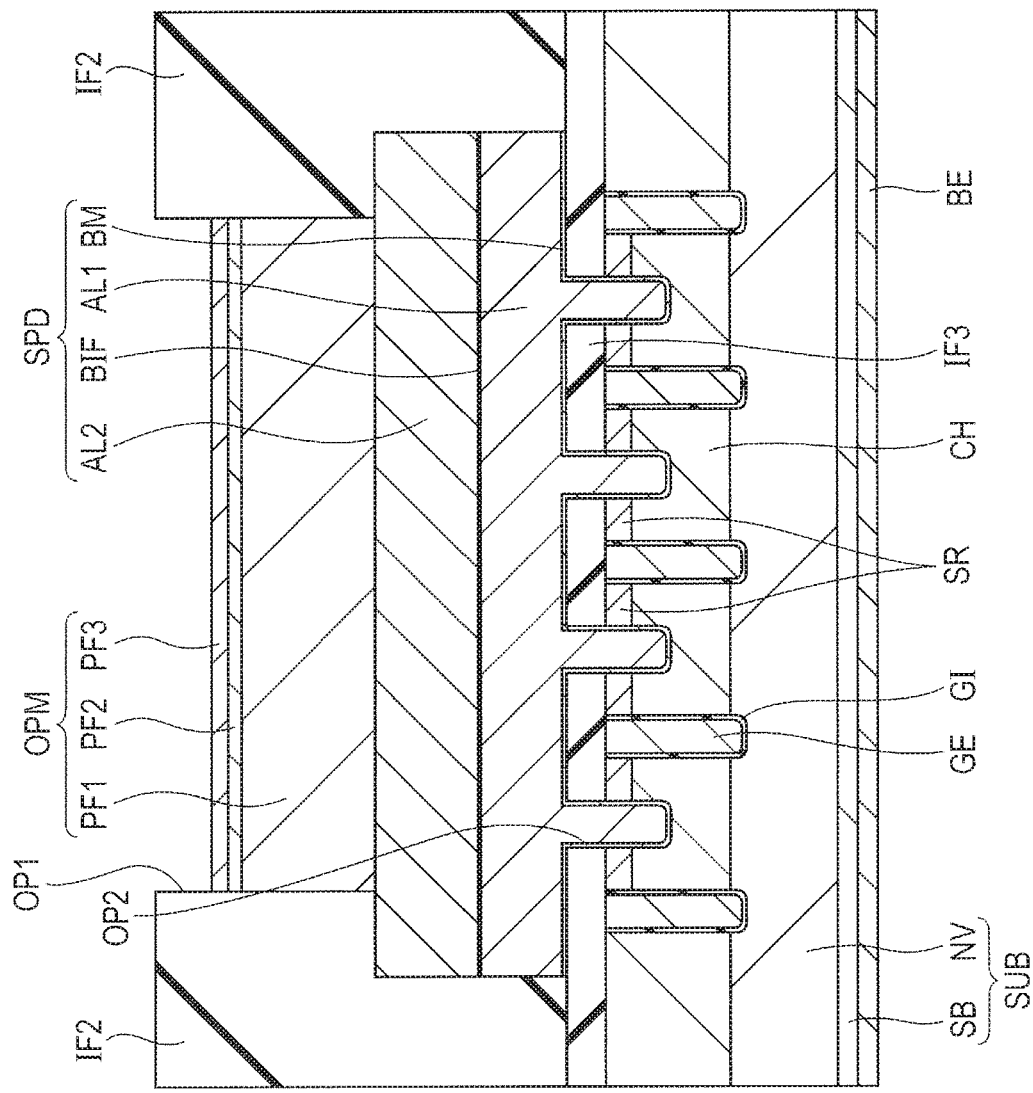
FIG. 13 is a cross-sectional view of the semiconductor device during the manufacturing process that follows FIG. 12.

Next, as shown in FIG. 13, the insulating film IF2 having the opening OP1 is formed over the conductive film AL2 so as to expose a portion of the conductive film AL2 serving as a portion of the source electrode SPD. It is to be noted that the method of forming the insulating film IF2 and its material are the same as those in the first embodiment.

Next, by sequentially forming the conductive films PF1 to PF3 using the same technique as in the first embodiment, the conductive layer OPM is formed over the conductive film AL2 in the opening OP1.

Then, as in the first embodiment, the back side of the substrate SB is polished to form the drain electrode (back electrode) BE.

The semiconductor device of the third embodiment is manufactured according to the above-mentioned steps.

As described above, according to the third embodiment, it is possible to suppress the separation between the source electrode SPD and the conductive layer OPM and to obtain the same effect as the first embodiment.

Figure 14:
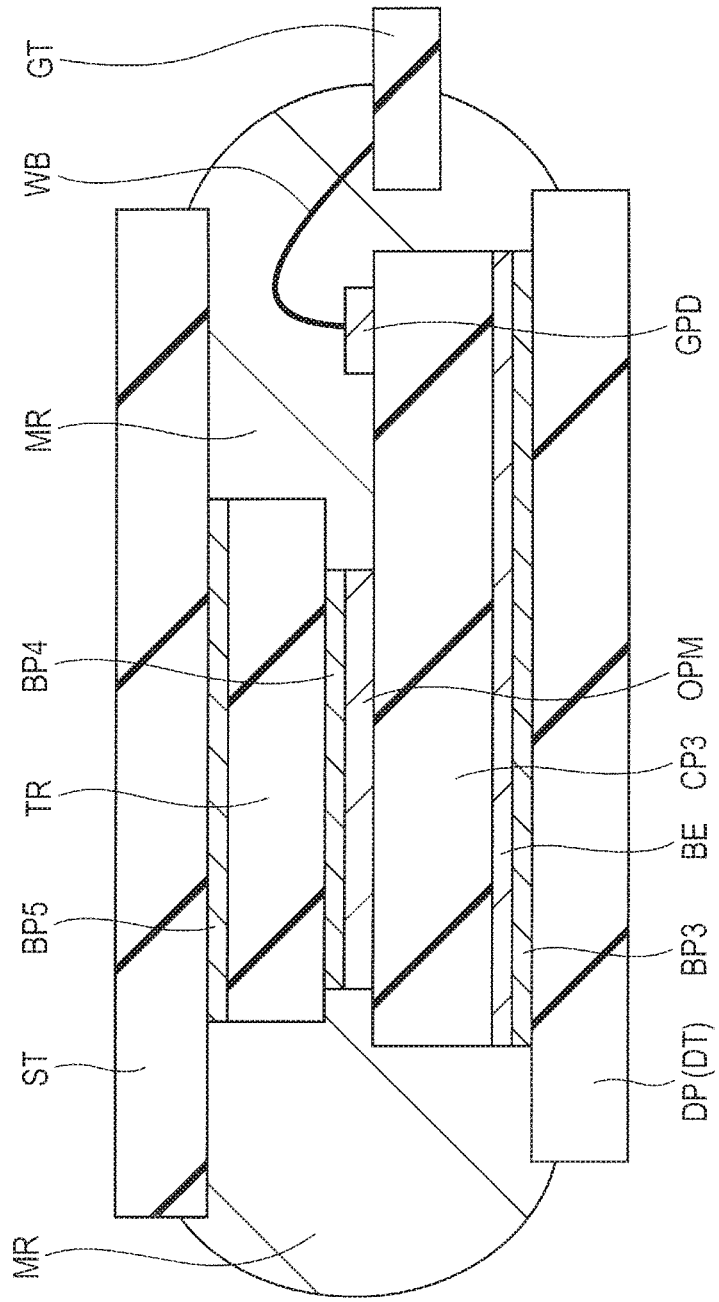
FIG. 14 is a plan view showing the semiconductor device of FIG. 13 in the mounted state.

FIG. 14 shows a view of a chip CP3 including the power MOS according to the third embodiment formed thereon in the packaged state. Here, as an example of the external connection terminal TR to be coupled to the conductive layer OPM, a case of using a clip made of a copper sheet is described.

As shown in FIG. 14, the chip CP3 is mounted over the die pad DP via a solder BP3. The die pad DP also serves as the power source potential terminal DT that supplies power source potential to the chip CP3. That is, the drain electrode BE of the chip CP3 is electrically coupled to the power source potential terminal DT (die pad DP) via the solder BP3.

Moreover, the external connection terminal TR is coupled to the chip CP3 via a solder BP4. The external connection terminal TR is electrically coupled to the ground potential terminal ST via a solder BP5. Here, the conductive layer OPM of the chip CP3 is coupled to the solder BP4. That is, the source electrode SPD of the chip CP3 is electrically coupled to the ground potential terminal ST via the conductive layer OPM, the solder BP4, the external connection terminal TR, and the solder BP5.

Moreover, the gate pad electrode GPD of the power MOS is coupled to a gate potential terminal GT via a bonding wire WB.

Such a chip CP3 is sealed with the sealing resin MR. In this manner, the semiconductor device according to the third embodiment is packaged.

Furthermore, it is also possible to apply the technique of the first and second modifications of the first embodiment and the second embodiment to the technique disclosed in the third embodiment.

Moreover, although the conductive film AL1 and the conductive film AL2 are employed as the source electrode SPD of the power MOS in the third embodiment, it is also possible to employ the conductive film AL1 and the conductive film AL2 as the emitter electrode of the IGBT. Furthermore, when applied to the IGBT, the channel region CH of the power MOS is a base region.

Moreover, when applying the technique disclosed in the third embodiment to the IGBT, the chip CP3 described in the third embodiment may be employed instead of the chip CP2 shown in FIGS. 8 to 10 of the first embodiment.

Although the invention made by the inventors are specifically described with reference to the embodiments, the invention is not limited to the embodiments but various modifications may be made without departing from the scope of the invention.

What is claimed is:

1. A semiconductor device comprising:
   a semiconductor substrate comprised of silicon;
   a pad electrode formed over the semiconductor substrate and comprising:
   a first conductive film; and
   a second conductive film formed over the first conductive film; and
   a plating film formed over the second conductive film and to be coupled to an external connection terminal,
   wherein the first conductive film is comprised of a film that is mainly comprised of aluminum doped with silicon,
   wherein the second conductive film is comprised of a material different from a material composing the first conductive film,
   wherein the second conductive film is comprised of one of 1) a film that is mainly comprised of aluminum doped with copper and 2) a film that is mainly comprised of aluminum doped with copper and silicon,
   wherein the first conductive film is in direct contact with a surface of the semiconductor substrate,
   wherein a crystal surface on a surface of the first conductive film takes over a crystal surface on the surface of the semiconductor substrate, and
   wherein a crystal surface on a surface of the second conductive film is different from the crystal surface on the surface of the first conductive film.

2. The semiconductor device according to claim 1,
   wherein the second conductive film is in direct contact with the plating film, and
   wherein the crystal surface on the surface of the second conductive film is a (111) surface.

3. The semiconductor device according to claim 2, wherein a first insulating film that is an oxide of a material composing the first conductive film is formed between the first conductive film and the second conductive film.

4. The semiconductor device according to claim 2, wherein an amorphous film comprised of a material different from both a material composing the first conductive film and a material composing the second conductive film is formed between the first conductive film and the second conductive film.

5. The semiconductor device according to claim 2, wherein a diode is formed on the semiconductor substrate, and wherein each of the crystal surface on the surface of the semiconductor substrate and the crystal surface on the surface of the first conductive film is a (001) surface.

6. The semiconductor device according to claim 2, wherein an area ratio of the (111) surface on the surface of the second conductive film is higher than an area ratio of the (111) surface on the surface of the first conductive film.

* * * * *